(12) United States Patent
Westmoreland et al.

(10) Patent No.: US 6,428,623 B2
(45) Date of Patent: *Aug. 6, 2002

(54) CHEMICAL VAPOR DEPOSITION APPARATUS WITH LIQUID FEED

(75) Inventors: Donald L. Westmoreland; Gurtej S. Sandhu, both of Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/097,489

(22) Filed: Jun. 15, 1998

Related U.S. Application Data

(63) Continuation of application No. 08/909,695, filed on Aug. 12, 1997, now abandoned, which is a continuation of application No. 08/395,942, filed on Feb. 28, 1995, now abandoned, which is a continuation-in-part of application No. 08/236,946, filed on May 2, 1994, now Pat. No. 5,393,564, which is a continuation-in-part of application No. 08/062,203, filed on May 14, 1993, now abandoned.

(51) Int. Cl.[7] ............................................. C23C 16/455
(52) U.S. Cl. ...................................... 118/715; 118/726
(58) Field of Search ........................... 427/248.1, 255.1, 427/255.2, 255.23, 255.28; 118/715, 726

(56) References Cited

U.S. PATENT DOCUMENTS

| | | | |
|---|---|---|---|
| 3,008,447 A | * | 11/1961 | Lacroix ...................... 118/725 |
| 4,176,209 A | | 11/1979 | Baker et al. ............ 427/248 B |
| 4,571,350 A | * | 2/1986 | Parker et al. ................ 427/109 |
| 4,649,857 A | * | 3/1987 | Hayashi et al. ............. 118/728 |

(List continued on next page.)

FOREIGN PATENT DOCUMENTS

| | | |
|---|---|---|
| FR | 2707671 | 1/1995 |
| WO | 86/00058 | 11/1986 |

OTHER PUBLICATIONS

Albin, D.S., et al., "Spray Pyrolysis Processing of Optoelectronic Materials", *Advanced Ceramic Materials*, vol. 2, No. 3A, pp. 243–252, (1987).

Versteeg, V.A., et al., "Metalorganic Chemical Vapor Deposition by Pulsed Liquid Injection Using Ultrasonic Nozzle: Titanium Dioxide on Sapphire from Titanium (IV) Isopropoxide", *J. of the American Ceramic Society*, vol. 78, No. 10. 2763–2767, (Oct. 1995).

*Primary Examiner*—Timothy Meeks
(74) *Attorney, Agent, or Firm*—Schwegman, Lundberg, Woessner & Kluth, P.A.

(57) ABSTRACT

The invention is a method directed to the use of a nonvolatile precursor, either a solid precursor or a liquid precursor, suitable for chemical vapor deposition (CVD), including liquid source CVD (LSCVD), of a semiconductor film. Using the method of the invention the nonvolatile precursor is dissolved in a solvent. The choice of solvent is typically an inorganic compound that has a moderate to high vapor pressure at room temperature and that can be liquified by a combination of pressure and cooling. The solution thus formed is then transported at an elevated pressure and/or a reduced temperature to the CVD chamber. In CVD the solution evaporates at a higher temperature and a lower pressure upon entry to the CVD chamber, and the nonvolatile precursor, in its gaseous state, along with a gas reactant, produces a product which is deposited as a thin film on a semiconductor wafer. In LSCVD the liquid enters the chamber, contacts the wafer, evaporates, produces a product which is deposited as a thin film on the wafer surface.

33 Claims, 1 Drawing Sheet

U.S. PATENT DOCUMENTS

| | | | |
|---|---|---|---|
| 4,689,247 A | | 8/1987 | Doty et al. ............... 427/126.1 |
| 4,906,493 A | | 3/1990 | Laine .......................... 427/226 |
| 4,970,093 A | * | 11/1990 | Sievers et al. .............. 427/314 |
| 4,993,361 A | | 2/1991 | Unvala ....................... 118/723 |
| 5,002,928 A | * | 3/1991 | Fukui et al. |
| 5,090,985 A | * | 2/1992 | Soubeyrand et al. ....... 65/60.52 |
| 5,120,703 A | | 6/1992 | Snyder et al. .................. 505/1 |
| 5,258,204 A | | 11/1993 | Wernberg et al. ........... 427/255 |
| 5,271,957 A | | 12/1993 | Wernberg et al. ........... 427/109 |
| 5,278,138 A | | 1/1994 | Ott et al. ........................ 505/1 |
| 5,300,321 A | | 4/1994 | Nakano et al. .......... 427/248.1 |
| 5,344,792 A | | 9/1994 | Sandhu et al. .............. 437/200 |
| 5,381,755 A | | 1/1995 | Glesener et al. ............... 117/88 |
| 5,393,564 A | | 2/1995 | Westmoreland et al. . 427/248.1 |
| 5,421,895 A | * | 6/1995 | Tsubouchi et al. |
| 5,451,260 A | * | 9/1995 | Versteeg et al. ............ 118/725 |
| 5,478,610 A | * | 12/1995 | Desu et al. .................. 427/573 |
| 5,505,781 A | * | 4/1996 | Omori et al. ................ 118/726 |
| 5,536,323 A | * | 7/1996 | Kirlin et al. ................. 118/726 |
| 5,688,565 A | | 11/1997 | McMillan et al. .......... 427/565 |
| 5,916,640 A | | 6/1999 | Liu et al. ..................... 427/475 |
| 5,924,012 A | | 7/1999 | Vaarstra ...................... 438/681 |
| 6,010,969 A | | 1/2000 | Vaarstra ...................... 438/758 |

* cited by examiner

CHEMICAL VAPOR DEPOSITION APPARATUS WITH LIQUID FEED

This Application is a continuation of U.S. Ser. No. 08/909,695, filed on Aug. 12, 1997, now abandon, which is a continuation of U.S. Ser. No. 08/395,942, filed on Feb. 28, 1995, now abandoned, which is a continuation in part of U.S. Ser. No. 08/236,946, filed on May 2, 1994, now U.S. Pat. No. 5,393,564, which is a continuation in part of U.S. Ser. No. 08/062,203, filed on May 14, 1993, now abandoned.

FIELD OF THE INVENTION

The invention relates to the manufacture of semiconductor circuits on semiconductor wafers, and more particularly to chemical vapor depositions of materials on the wafer.

BACKGROUND OF THE INVENTION

A large number of nonvolatile metal organic precursors which are suitable in microelectronics applications for chemical vapor deposition (CVD) of thin films are solids at temperatures at or below 1500 Kelvin and at pressures at or above $10^{-10}$ Torr. In fact, a majority of metal-organic compounds with attributes desirable for CVD are solids. These compounds have chemical stability, molecular structures, and reactivity which make them ideally suited for CVD application. However, vapor transport is difficult to perform under temperatures and pressures typically utilized in semiconductor manufacture. Thus, vapor transport of these precursors is a major hinderance to the implementation of the precursors in a production environment. If the precursor has a sufficient vapor pressure, then sublimation of the precursor for transportation of its vapor is the only option available, however this is difficult to control in a manufacturing environment. Solid precursors have been dissolved, transported, and delivered in organic solution, but these solutions usually leave a large carbon residue.

OBJECTS OF THE INVENTION

It is an object of the invention to provide reliable production worthy methods for fast delivery of nonvolatile precursors to the chemical vapor deposition (CVD) chamber.

The invention features dissolving a nonvolatile precursor, either solid or liquid, in a solution and delivering the precursor in the solution to a CVD chamber.

The invention is a very efficient method for transporting a nonvolatile precursor for CVD in the manufacturing environment and incorporates a minimum amount of unwanted by-product in the desired film. The method entails a process which is easily controlled and therefore predictable with repeatable results.

SUMMARY OF THE INVENTION

The invention includes apparatus adapted to carry out a method directed to the use of a nonvolatile precursor, either solid or liquid, in a chemical vapor deposition (CVD) process. A solid precursor, as referenced herein, is a precursor which is in a solid state at a temperature at or below 1500 Kelvin and at a pressure at or above $10^{-10}$ Torr, and a liquid precursor, as referenced herein, is a precursor which is in a liquid state at a temperature at or below 1500 Kelvin and at a pressure at or above $10^{-10}$ Torr. Using the method of the invention the nonvolatile precursor is dissolved in a solvent to form a solution. The nonvolatile precursor is then transported in the solution at a pressure and a temperature necessary to maintain it as a liquid to the CVD chamber. The solution is transported in a continuous liquid stream to the CVD chamber. A continuous liquid stream is an unbroken non-nebulized stream of liquid which may be passed to the chamber without interruption or may be passed to the chamber in a pulse or batch. The pulse or batch can be thought of as a portion of the solution.

In a first embodiment the solution becomes a gas during rapid evaporation of the solution at a high temperature and at a low pressure. The gaseous form of the precursor reacts with a reactant at the heated surface of the wafer.

In a second embodiment the method of the invention can be used in liquid source chemical vapor deposition where the solution is applied to the wafer before being evaporated.

DETAILED DESCRIPTION OF THE INVENTION

Figure 1:
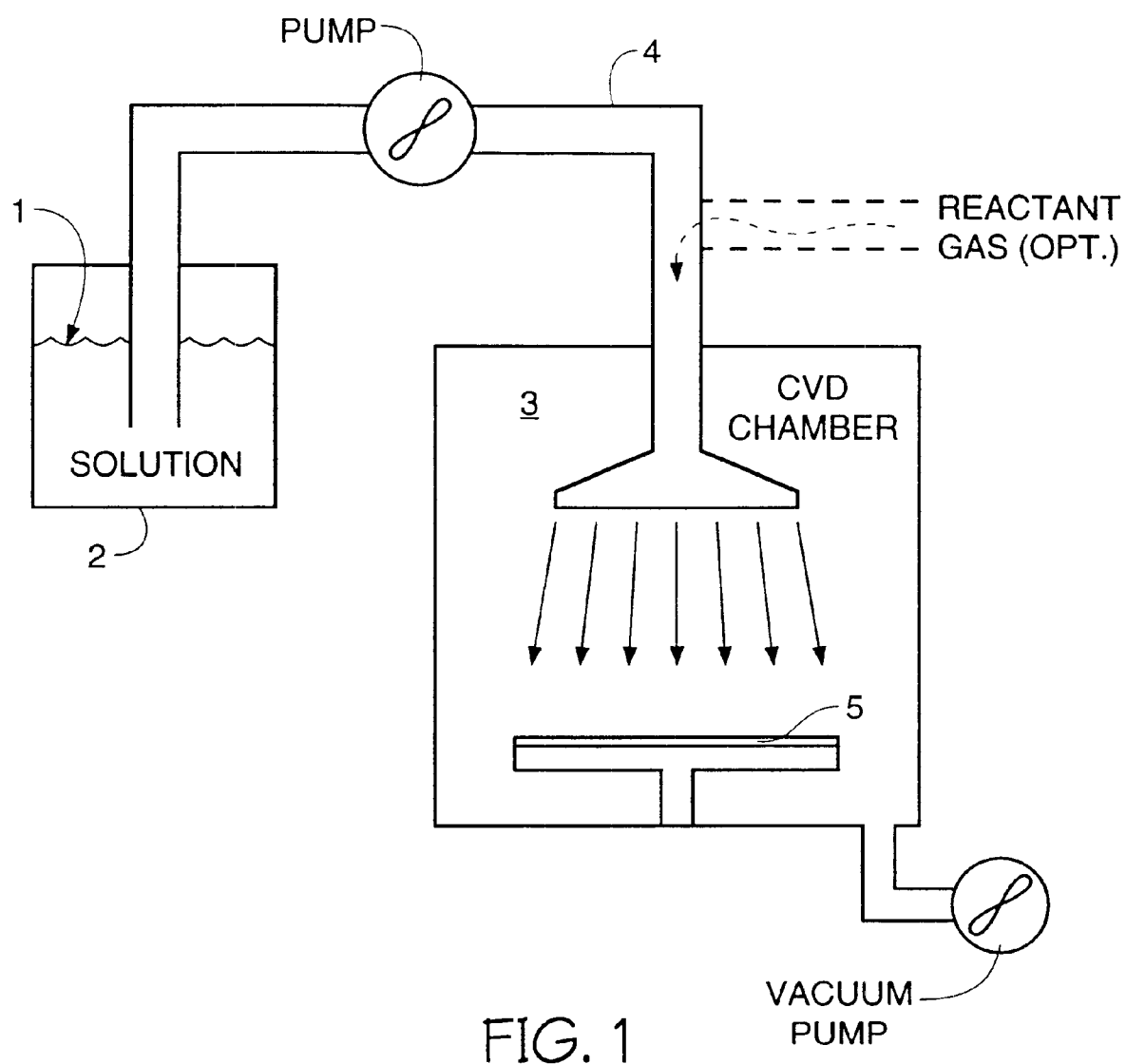
FIG. 1 is a cross section of a simplified representation of the equipment used to perform a chemical vapor deposition on a semiconductor wafer.

The invention is a method directed to the use of a nonvolatile precursor suitable for chemical vapor deposition (CVD). The nonvolatile precursor may be a solid or a liquid. The solid precursor, as referenced herein, is a precursor which is in a solid state at a temperature at or below 1500 Kelvin and at a pressure at or above $10^{-10}$ Torr, and the liquid precursor, as referenced herein, is in a liquid state at a temperature at or below 1500 degrees Kelvin and at a pressure at or above $10^{-10}$ Torr. The method can be understood by studying FIG. 1 in conjunction with the following description. Using the method of the invention, the nonvolatile precursor is dissolved in a solvent to form a solution 1 of the precursor and the solvent. It is important that the precursor and the solvent do not react with each other in liquid form. The solvent can be either a reactive component which makes up a part of the film or it can be simply a nonreactive inert carrier.

The solution 1 is formed in a chamber 2. The solution 1 is then transported in liquid form at elevated pressures and/or reduced temperatures to a chamber 3 through a transport device 4. The liquid is transported as a continuous liquid stream to the chamber 3. A continuous liquid stream is an unbroken non-nebulized stream of liquid which may be passed to the chamber without interruption or may be passed to the chamber in a pulse or batch. The pulse or batch can be thought of as a portion of the solution. When the solution 1 reaches the chamber 3, at least two options are available.

In a first embodiment the solution 1 becomes a gas upon entry to the chamber 3. The chamber 3 is held at a high enough temperature and a low enough pressure to effect rapid evaporation of the solution 1. The precursor remains in the gas phase until it reacts with a reactant at a heated surface of the wafer 5. The reactant may be either the solvent in its gaseous state or may be another gas injected into the chamber 3. In either case a material is produced during the reaction and deposited as a film on the wafer 5. Typically, a gaseous by-product is also produced in the reaction.

One example of the first embodiment comprises a solid precursor of bis(cyclopentadienyl)titanium diazide (Tiaz) dissolved in liquid ammonia ($LNH_3$) to form a solution 1 of Tiaz in $LNH_3$ in chamber 2 when the temperature of chamber 2 is 20° C. or less and the pressure is 120 psi or greater. The Tiaz in $LNH_3$ is then transported to the chamber 3 through the transport device 4. The temperature and pressure of the transport device 4 are regulated in order to keep the solution in it liquid form. In this example the temperature is 20° or less and the pressure is 120 psi or greater. The solution 1 immediately vaporizes upon entry into chamber 3. The rapid evaporation occurs because the chamber 3 is held at a temperature of 100° C. and a pressure of 500 millitorr and the wafer surface is held at 550° C. Hydrogen is injected into the chamber and combines with the vaporized Tiaz to form titanium nitride which is deposited on the wafer as a thin film. A by-product cyclopentadiene remains and is pumped from the chamber with the ammonia vapor.

The temperatures and pressures may be varied as long as the temperature and pressure of the chamber and transport device allow the precursor to remain dissolved in the solution. In addition the temperature and pressure of the chamber may vary as long as the solution is vaporized.

In a second embodiment, the solution 1 is applied to the wafer 5 before being evaporated. This is typically referred to as liquid source chemical vapor deposition. The solution is delivered through a nebulizer which delivers a very fine mist that settles evenly over the entire wafer. When the solution first contacts the wafer the temperature of the wafer 5 may be either higher, or lower, or the same as the temperature of the solution 1. In the first case the wafer temperature and chamber 3 pressure must be maintained so that the solvent evaporates upon contact with the wafer surface and so that the precursor reacts immediately with the reactant gas, which is either injected into the chamber or formed during evaporation of the solution, to deposit a film. In the latter two cases, the solution remains on the wafer until the wafer temperature is increased to evaporate the solvent. As in the case of the first embodiment the gaseous state of the precursor reacts with a gas reactant thereby producing a material deposited as a film on the wafer surface. The reaction typically produces a gaseous by-product in addition to the deposited film. The by-product and the solvent vapor, in the case where the vapor doesn't react with the precursor to form the film, are then removed from the chamber 3.

An example of the process of the second embodiment comprises a precursor, zirconium tetrachloride, dissolved in a solvent, silicon tetrachloride, to form a solution in chamber 2 when the temperature of the chamber 2 is between 60° and 10° C. and the pressure is 60 psi or greater. The solution is then transported to the chamber 3 through the transport device 4. The temperature and pressure of the transport device 4 are regulated in order to maintain the solution in its liquid form. In this example the temperature and pressure of the transport device 4 are the same as the temperature and pressure of chamber 2. Chamber 3 is held at a pressure of 10 torr in order to help facilitate the vaporization of the solution on the wafer. The wafer temperature is 600° C. The zirconium tetrachloride in silicon tetrachloride solution is injected into the chamber 3 and reacts at the wafer surface to form a vapor and combines with hydrogen to form zirconium silicide which is deposited on the wafer to form a thin film. A by-product, hydrogen chloride, is formed and is pumped from the chamber with the excess silicon tetrachloride.

It is important to use the correct solvent when performing the method of the invention. The solvent must be able to evaporate quickly and leave no contaminates in the product film. Therefore common hydrocarbon solvents are unacceptable because they leave carbon residue incorporated in the wafer film, dependent on the wafer. Ideal solvents for this application are inorganic liquids such as: liquid ammonia ($NH_3$), liquid $NO_2$, liquid $SO_2$, liquid $TiCl_4$, liquid $TaCl_5$, liquid $WF_6$, liquid $SiCl_4$, borazine, dimethyl hydrazine, liquid xenonflourides, liquid phosphine, liquid arsine, diethylzinc, $BCl_3$, $BF_3$, $SF_6$, $H_2S$, $SiF_4$, $CBrF_3$, $CCl_2F_2$, $CCl_3F$, $CClF_3$, $CCl_4$, $SiH_2Cl_2$. Many of these solvents are gases at room temperature but are easily maintained as liquids with elevated pressure and reduced temperature. For example, ammonia boils at −33° C. and is an excellent solvent. It is a further advantage that these gases are easily available at a low cost at the present time.

The following gases may be selected as reactant gases for forming the deposited film: hydrogen, ammonia, or silane.

The following are some of the solid precursors suitable for forming films on semiconductor wafers by the method of the invention: bis(cyclopentadienyl) titanium dichloride, ZrC14, and tungsten carbonyl.

The following are some of the nonvolatile liquid precursors suitable for forming films on semiconductor wafers by the method of the invention: indenyltris(dimethylamido) zirconium, cyclopentadienyltris(diethylamido)titanium, and bis(cyclopentadienyl)bis(dimethylamido)titanium.

There are various combinations of nonvolatile precursors, solvents and reactants that may be used in the process of the invention.

It has been shown that the invention provides an efficient method for transporting nonvolatile precursors for CVD in the manufacturing environment.

Although the invention has been described in terms of a depositing materials on semiconductor wafers during chemical vapor depositions, the circuit and method have utility in other processes where a chemical vapor deposition is desired. Accordingly the invention should be read as limited only by the claims.

What is claimed is:

1. A liquid source chemical vapor deposition system, comprising:

a solution chamber containing a solution, the solution comprising a nonvolatile precursor dissolved in a liquid solvent, the solution chamber adapted to be maintained at a pressure and a temperature sufficient to keep the solution in a liquid state;

a chemical vapor deposition chamber;

a transport device adapted to deliver the solution from the solution chamber to a nebulizer within the chemical vapor deposition chamber, the transport device adapted to be maintained at a pressure and temperature sufficient to keep the solution in a liquid state, the transport device adapted to transport the solution as a continuous liquid stream from the solution chamber to the chemical deposition chamber and to deliver the continuous liquid stream to the nebulizer in the chemical vapor deposition chamber; and wherein the liquid solvent is selected from the group consisting of liquid ammonia, liquid $NO_2$, liquid $SO_2$, liquid $TiCl_4$, liquid xenonflourides, liquid phosphine, liquid arsine, diethylzinc, $BCl_3$, $BF_3$, $SF_6$, $H_2S$, $SiF_4$, $CBrF_3$, $CCl_2F_2$, $CCl_3F$, $CClF_3$, $CCl_4$, and $SiH_2Cl_2$.

2. The system of claim 1, wherein the precursor is a solid.

3. The system of claim 1, wherein the precursor is bis(cyclopentadienyl) titanium dichloride, $ZrCl_4$, or tungsten carbonyl.

4. The system of claim 1, wherein the precursor is a nonvolatile liquid.

5. The system of claim 1, wherein the precursor is indenyltris(dimethylamido)zirconium, cyclopentadienylitris (diethylamido)titanium, or bis(cyclopentadienyl)bis(dimethylamido)titanium.

6. The system of claim 1, wherein the transport device is maintained at a pressure and a temperature that is the same as the pressure and the temperature of the solution chamber.

7. A chemical vapor deposition system, comprising:
   a solution chamber containing a solution, the solution comprising a nonvolatile precursor dissolved in a volatile solvent, the solution chamber adapted to be maintained at a pressure and a temperature sufficient to keep the solution in a liquid state;
   a chemical vapor deposition chamber;
   a transport device adapted to deliver the solution from the solution chamber to the chemical vapor deposition chamber, the transport device adapted to be maintained at a pressure and temperature sufficient to keep the solution in a liquid state, the transport device adapted to transport the solution as a continuous liquid stream from the solution chamber to the chemical deposition chamber and delivers the continuous liquid stream to the chemical vapor deposition chamber,
   wherein the chemical vapor deposition chamber is adapted to be maintained at a pressure and temperature sufficient to effect rapid evaporation of the liquid state solution upon entry into the chemical vapor deposition chamber; and
   wherein the volatile solvent is selected from the group consisting of liquid ammonia, liquid $NO_2$, liquid $SO_2$, liquid $TiCl_4$, liquid xenonflourides, liquid phosphine, liquid arsine, diethylzinc, $BCl_3$, $BF_3$, $SF_6$, $H_2S$, $SiF_4$, $CBrF_3$, $CCl_2F_2$, $CCl_3F$, $CClF_3$, $CCl_4$, and $SiH_2Cl_2$.

8. The system of claim 7, wherein the transport device is maintained at a pressure and a temperature that is the same as the pressure and the temperature of the solution chamber.

9. The system of claim 7, wherein the pressure of both the solution chamber and the transport device are maintained at a pressure of 120 psi or greater and a temperature of 20° C. or less.

10. The system of claim 9, wherein the pressure of the chemical vapor deposition chamber is 500 millitorr and the temperature of the chemical vapor deposition chamber is 100° C.

11. The system of claim 9, wherein the precursor is bis(cyclopentadienyl)titanium diazide.

12. A liquid source chemical vapor deposition system, comprising:
   a solution chamber containing a solution, the solution comprising a nonvolatile precursor dissolved in a solvent, the solution chamber adapted to be maintained at a pressure and a temperature sufficient to keep the solution in a liquid state;
   a chemical vapor deposition chamber containing a wafer;
   a transport device adapted to deliver the solution from the solution chamber to the chemical vapor deposition chamber, the transport device adapted to be maintained at a pressure and temperature sufficient to keep the solution in a liquid state, the transport device adapted to transport the solution as a continuous liquid stream from the solution chamber to the chemical deposition chamber and to deliver the continuous liquid stream to the chemical vapor deposition chamber, wherein the temperature of the wafer and the pressure of the chemical vapor deposition chamber are maintained so that the solvent only evaporates upon contact with the wafer; and
   wherein the solvent is selected from the group consisting of liquid ammonia, liquid $NO_2$, liquid $SO_2$, liquid $TiCl_4$, liquid xenonflouides, liquid phosphine, liquid arsine, diethylzine, $BCl_3$, $BF_3$, $SF_6$, $H_2S$, $SiF_4$, $CBrF_3$, $CCl_2F_2$, $CCl_3F$, $CClF_3$, $CCl_4$, and $SiH_2Cl_2$.

13. The system of claim 12, wherein the transport device is maintained at a pressure and a temperature that is the same as the pressure and the temperature of the solution chamber.

14. The system of claim 12, wherein the pressure of both the solution chamber and the transport device are maintained at a pressure of 60 psi or greater and a temperature between 60° C. and 10° C.

15. The system of claim 14, wherein the pressure of the chemical vapor deposition chamber is 10 torr and the temperature of the wafer is 600° C.

16. The system of claim 14, wherein the precursor is zirconium tetrachloride.

17. A chemical vapor deposition system, comprising:
   a solution chamber containing a solution, the solution comprising a nonvolatile precursor dissolved in a volatile solvent, the solution chamber adapted to be maintained at a pressure and a temperate sufficient to keep the solution in a liquid state;
   a chemical vapor deposition chamber containing a wafer and a reactant adapted to react with the precursor to produce a thin film on the wafer;
   a transport device adapted to deliver the solution from the solution chamber to the chemical vapor deposition chamber, the transport device adapted to be maintained at a pressure and temperature sufficient to keep the solution in a liquid state, the transport device adapted to transport the solution as a continuous liquid stream from the solution chamber to the chemical deposition chamber and delivers the continuous liquid stream into the chemical vapor deposition chamber;
   wherein the chemical vapor deposition chamber is adapted to be maintained at a pressure and temperature sufficient to effect rapid evaporation of the solution upon entry into the chemical vapor deposition chamber, and
   wherein the volatile solvent is selected from the group consisting of liquid ammonia, liquid $NO_2$, liquid $SO_2$, liquid $TiCl_4$, liquid xenonflourides, liquid phosphine, liquid arsine, diethylzinc, $BCl_3$, $BF_3$, $SF_6$, $H_2S$, $SiF_4$, $CBrF_3$l $CCl_2F_2$, $CCl_3F$, $CClF_3$, $CCl_4$, and $SiH_2Cl_2$.

18. The system of claim 17, wherein the reactant is the solvent in a gaseous state.

19. The system of claim 17, wherein the precursor is bis(cyclopentadienyl)titanium diazide.

20. The system of claim 17, wherein the reactant is hydrogen, ammonia, or silane.

21. The system of claim 17, wherein the reactant is hydrogen.

22. A chemical vapor deposition system, comprising:
   a solution chamber containing a solution, the solution comprising a solid precursor of bis(cyclopentadienyl)titanium diazide dissolved in liquid ammonia, the solution chamber adapted to be maintained at a pressure and a temperature sufficient to keep the solution in a liquid state;
   a chemical vapor deposition chamber containing a wafer and a reactant adapted to react with the precursor to produce a thin film on the wafer;
   a transport device adapted to deliver the solution from the solution chamber to the chemical vapor deposition chamber, the transport device adapted to be maintained at a pressure and temperature sufficient to keep the solution in a liquid state, the transport device adapted to transport the solution as a continuous liquid stream from the solution chamber to the chemical deposition chamber and delivers the continuous liquid stream into the chemical vapor deposition chamber; and wherein the chemical vapor deposition chamber is adapted to be maintained at a pressure and temperature sufficient to effect rapid evaporation of the continuous liquid stream of the solution upon entry into the chemical vapor deposition chamber.

23. The system of claim 22, wherein the reactant is hydrogen.

24. The system of claim 22, wherein the solution chamber is maintained at a temperature of 20° C. or less and a pressure of 120 psi or greater.

25. The system of claim 22, wherein the transport device is maintained at a temperature of 20° C. or less and a pressure of 120 psi or greater.

26. A liquid source chemical vapor deposition system, comprising:

a solution chamber containing a solution, the solution comprising a nonvolatile precursor dissolved in a solvent, the solution chamber adapted to be maintained at a pressure and a temperature sufficient to keep the solution in a liquid state;

a chemical vapor deposition chamber containing a wafer and a reactant adapted to react with the precursor to produce a thin film on the wafer, the chemical vapor deposition chamber adapted to deliver the solution through a nebulizer;

a transport device adapted to deliver the solution from the solution chamber to the nebulizer in the chemical vapor deposition chamber, the transport device adapted to be maintained at a pressure and temperature sufficient to keep the solution in a liquid state, the transport device adapted to transport the solution as a continuous liquid stream from the solution chamber to the chemical deposition chamber and deliver the continuous liquid stream through the nebulizer in the chemical vapor deposition chamber to produce a nebulized solution, wherein the temperature of the wafer and the pressure of the chemical vapor deposition chamber are maintained so that the solvent of the nebulized solution evaporates upon contact with the wafer; and wherein the solvent is selected from the group consisting of liquid ammonia, liquid $NO_2$, liquid $SO_2$, liquid $TiCl_4$, liquid xenonflourides, liquid phosphine, liquid arsine, diethylzine, $BCl_3$, $BF_3$, $SF_6$, $H_2S$, $SiF_4$, $CBrF_3$, $CCl_2F_2$, $CCl_3F$, $CClF_3$, $CCl_4$, and $SiH_2Cl_2$.

27. The system of claim 26, wherein the reactant is hydrogen.

28. The system of claim 26, wherein the solution chamber is maintained at a temperature between 60° C. and 10° C. and a pressure of 60 psi or greater.

29. The system of claim 26, wherein the transport device is maintained at a temperature between 60° C. and 10° C. and a pressure of 60 psi or greater.

30. A liquid source chemical vapor deposition system, comprising:

a solution chamber containing a solution, the solution comprising a zirconium tetrachloride dissolved in silicon tetrachloride, the solution chamber adapted to be maintained at a pressure and a temperature sufficient to keep the solution in a liquid state;

a chemical vapor deposition chamber containing a wafer and a reactant adapted to react with the zirconium tetrachloride to produce a thin film on the wafer, the chemical vapor deposition chamber adapted to deliver the solution through a nebulizer; and a transport device adapted to deliver the solution from the solution chamber to the nebulizer in the chemical vapor deposition chamber, the transport device adapted to be maintained at a pressure and temperature sufficient to keep the solution in a liquid state, the transport device adapted to transport the solution as a continuous liquid stream from the solution chamber to the chemical deposition chamber and deliver the continuous liquid stream through the nebulizer to the wafer, wherein the temperature of the wafer and the pressure of the chemical vapor deposition chamber are maintained so that the solvent evaporates upon contact with the wafer.

31. The system of claim 30, wherein the reactant is hydrogen.

32. The system of claim 30, wherein the solution chamber is maintained at a temperature between 60° C. and 10° C. and a pressure of 60 psi or greater.

33. The system of claim 30, wherein the transport device is maintained at a temperature between 60° C. and 10° C. and a pressure of 60 psi or greater.

* * * * *